United States Patent [19]
Ovshinsky et al.

[11] Patent Number: 4,492,810
[45] Date of Patent: * Jan. 8, 1985

[54] OPTIMIZED DOPED AND BAND GAP ADJUSTED PHOTORESPONSIVE AMORPHOUS ALLOYS AND DEVICES

[75] Inventors: Stanford R. Ovshinsky, Bloomfield Hills; Masatsugu Izu, Southfield, both of Mich.

[73] Assignee: Sovonics Solar Systems, Solon, Ohio

[*] Notice: The portion of the term of this patent subsequent to Jul. 27, 1999 has been disclaimed.

[21] Appl. No.: 442,895

[22] Filed: Nov. 19, 1982

Related U.S. Application Data

[60] Continuation-in-part of Ser. No. 368,221, Apr. 14, 1982, which is a division of Ser. No. 185,520, Sep. 9, 1980, Pat. No. 4,342,044, which is a continuation-in-part of Ser. No. 884,664, Mar. 8, 1978, Pat. No. 4,217,374, and Ser. No. 104,285, Dec. 17, 1979, abandoned, which is a division of Ser. No. 884,664.

[51] Int. Cl.$^3$ .......................................... H01L 31/06
[52] U.S. Cl. .................... 136/255; 136/258; 427/39; 427/42; 427/51; 427/74; 357/2; 357/15; 357/30; 252/62.3 R; 252/62.3 E; 148/33; 148/33.5; 148/33.6; 430/85; 430/86; 420/556; 420/578
[58] Field of Search ................ 75/134 S; 252/62.3 R, 252/62.3 E; 427/39, 74, 42, 51; 136/255, 258 AM; 357/2, 15, 30; 430/85-86; 250/211 J, 212; 204/192 S, 192 P, 192 N; 148/1.5, 171, 177, 33, 33.4, 33.5, 33.6; 420/556, 578

[56] References Cited

U.S. PATENT DOCUMENTS

| | | | |
|---|---|---|---|
| 4,064,521 | 12/1977 | Carlson | 357/2 |
| 4,066,527 | 1/1978 | Takagi et al. | 204/192 N |
| 4,196,438 | 4/1980 | Carlson | 357/15 |
| 4,217,374 | 8/1980 | Ovshinsky et al. | 427/39 |
| 4,226,898 | 10/1980 | Ovshinsky et al. | 427/39 |
| 4,261,771 | 4/1981 | Dingle et al. | 148/175 |
| 4,342,044 | 7/1982 | Ovshinsky et al. | 357/2 |

FOREIGN PATENT DOCUMENTS 2038086 7/1980 United Kingdom ........ 136/258 AM

OTHER PUBLICATIONS

A. R. Kirkpatrick et al., "Amorphous Silicon Films for Solar Cells by Ionized Cluster Beam Deposition", Extended Abstract No. 76, Electrochemical Society Meeting, Montreal, Canada, May 9-14, 1982.

Dow et al., "Random Super Structures", Physical Review B, vol. 25, No. 10, pp. 6218-6224, (May 15, 1982).

Abeles, et al., "Amorphous Semiconductor Superlattices", Physical Review Letters, vol. 51, No. 21, pp. 2003-2006, (Nov. 21, 1983).

Knights, et al., "Growth Morphology in Plasma-Deposited a-Si:H Films", Journal of Non-Crystalline Solids, vols. 35 and 36, pp. 159-170, (1980).

Primary Examiner—Aaron Weisstuch

[57] ABSTRACT

The production of improved photoresponsive amorphous alloys and devices, such as photovoltaic, photoreceptive devices and the like. The alloys and devices have improved wavelength threshold characteristics made possible by introducing one or more band gap adjusting elements and dopants into the alloys and devices in layers and/or clusters. The dopants and adjusting element or elements are added to the amorphous devices containing silicon and at least one reducing element, such as hydrogen. One adjusting element is germanium which narrows the band gap from that of the materials without the adjusting element incorporated therein. Other adjusting elements can be used such as tin or nitrogen along with conventional dopants. The silicon and adjusting elements are concurrently combined and deposited as amorphous alloys by vapor deposition, sputtering or glow discharge decomposition.

The addition of the adjusting element(s) to the alloy in layers or clusters adjusts the band gap to a selected optimum wavelength threshold for a particular device to increase the photoabsorption efficiency to enhance the device photoresponsiveness without deleteriously adding states in the gap which decrease the efficiency of the devices. The dopants also are added in thin enough layers or clusters between undoped layers or portions so that the optical and electronic properties of the resulting alloys are not degraded. The dopants and adjusting element(s) can be added in varying amounts, in discrete layers and/or clusters or in substantially constant amounts in the alloys and devices.

83 Claims, 13 Drawing Figures

OPTIMIZED DOPED AND BAND GAP ADJUSTED PHOTORESPONSIVE AMORPHOUS ALLOYS AND DEVICES

CROSS-REFERENCES TO RELATED APPLICATIONS

This is a continuation-in-part of application Ser. No. 368,221, filed Apr. 14, 1982, which is a division of application Ser. No. 185,520, filed Sept. 9, 1980 now U.S. Pat. No. 4,342,044, which is a continuation-in-part of application Ser. No. 884,664, filed Mar. 8, 1978, now U.S. Pat. No. 4,217,374 and application Ser. No. 104,285, filed Dec. 17, 1979, now abandoned, which is a division of application Ser. No. 884,664.

BACKGROUND OF THE INVENTION

This invention relates to a method of making doped and/or band gap adjusted amorphous alloys having improved photoresponsive characteristics and devices made therefrom. The invention has its most important application in making improved photoresponsive alloys and devices having tailor made band gaps and good doping properties for specific photoresponsive applications including photoreceptive devices such as solar cells of a p-i-n, p-n, Schottky or MIS (metal-insulator-semiconductor) type; photoconducting medium such as utilized in xerography; photodetecting devices and photodiodes including large area photodiode arrays.

Silicon is the basis of the huge crystalline semiconductor industry and is the material which has produced expensive high efficiency (18 percent) crystalline solar cells. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impassable economic barrier to the large scale use of crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other problem defects.

An additional shortcoming of the crystalline material, for solar applications, is that the crystalline silicon band gap of about 1.1 eV inherently is below the optimum band gap of about 1.5 eV. The admixture of germanium, while possible, further narrows the band gap which further decreases the solar conversion efficiency.

In summary, crystal silicon devices have fixed parameters which are not variable as desired, require large amounts of material, are only producible in relatively small areas and are expensive and time consuming to produce. Devices manufactured with amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystal silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. LeComber of Carnegie Laboratory of Physics, University of Dundee, in Dundee, Scotland, did some work on "Substitutional Doping of Amorphous Silicon", as reported in a paper published in *Solid State Communications,* Vol. 17, pp. 1193–1196, (1975), toward the end of reducing the localized states in the energy gap in amorphous silicon or germanium to make the same approximate more closely intrinsic crystalline silicon or germanium and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein silane ($SiH_4$) gas was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material, phosphine ($PH_3$) gas for n-type conduction or diborane ($B_2H_6$) gas for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the amorphous material approximate more nearly the corresponding crystalline material.

D. I. Jones, W. E. Spear, P. G. LeComber, S. Li, and R. Martins also worked on preparing a-Ge:H from $GeH_4$ using similar deposition techniques. The material obtained gave evidence of a high density of localized states in the energy gap thereof. Although the material could be doped the efficiency was substantially reduced from that obtainable with a-Si:H. In this work reported in *Philsophical Magazine B*, Vol. 39, p. 147 (1979) the authors conclude that because of the large density of gap states the material obtained is ". . . a less attractive material than a-Si for doping experiments and possible applications."

In working with a similar method of glow discharge fabricated amorphous silicon solar cells utilizing silane, D. E. Carlson attempted to utilize germanium in the cells to narrow the optical gap toward the optimum solar cell value of about 1.5 eV from his best fabricated solar cell material which has a band gap of 1.65–1.70 eV. (D. E. Carlson, *Journal of Non-Crystalline Solids*, Vol. 35 and 36 (1980) pp. 707–717, given at 8th International Conference on Amorphous and Liquid Semi-Conductors, Cambridge, Mass., Aug. 27–31, 1979). However, Carlson has further reported that the addition of germanium from germane gas was unsuccessful because it causes significant reductions in all of the photovoltaic parameters of the solar cells. Carlson indicated that the degradation of photovoltaic properties indicates that defects in the energy gap are being created in the deposited films. (D. E. Carlson, *Tech. Dig.* 1977 *IEDM*, Washington, D.C., p. 214).

In a recent report on increasing the cell efficiency of multiple-junction (stacked) solar cells of amorphous silicon (a-Si:H) deposited from silane in the above manner, the authors reported that "[g]ermanium has been found to be a deleterious impurity in a-Si:H, lowering its $J_{sc}$ exponentially with increasing Ge . . . " From their work as well as that of Carlson, they concluded that alloys of amorphous silicon, germanium and hydrogen "have shown poor photovoltaic properties" and thus new "photovoltaic film cell materials must be found having spectral response at about 1 micron for efficient stacked cell combinations with a-Si:H." (J. J. Hanak, B. Faughnan, V. Korsun, and J. P. Pellicane, presented at the 14th IEEE Photovoltaic Specialists Conference, San Diego, Calif., Jan. 7–10, 1980).

The incorporation of hydrogen in the above method not only has limitations based upon the fixed ratio of hydrogen to silicon in silane, but, most importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the silane deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters. Further, the previous attempts to decrease the band gap of the material, while successful in reducing the gap, have at the same time added states in the gap. The increase in the states in the band gap results in a decrease or total loss in photoconductivity and is thus counterproductive in producing photoresponsive devices.

After the development of the glow discharge deposition of silicon from silane gas was carried out, work was done on the sputter depositing of amorphous silicon films in an atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

Numerous attempts to construct both natural and new crystalline analog materials by layering have been made with the aim of extending the range of material properties heretofore limited by the availability of natural crystalline materials. One such attempt is compositional modulation by molecular beam epitaxy (MBE) deposition on single crystal substrates. For example, in Dingle et al., U.S. Pat. No. 4,261,771, the fabrication of monolayer semiconductors by one MBE technique is described. These modulated prior art structures are typically called "superlattices". Superlattices are developed on the concept of layers of materials forming a one-dimensional periodic potential by a periodic variation of alloy composition or of impurity density. Typically, the largest period in these superlattices is on the order of a few hundred Angstroms; however, monatomic layered structures have also been constructed. The superlattices can be characterized by the format of several layers of A (such as GaAs) followed by several layers of B (such as AlAs), in a repetitive manner; formed on a single crystal substrate. The desired superlattice is a single crystal synthetic material with good crystalline quality and long range order. The conventional superlattice concepts have been utilized for special electronic and optical effects.

In addition to superlattices, Dingle discloses quasisuperlattices and non-superlattice structures. The former are comprised of epitaxially grown islands of a foreign material in an otherwise homogeneous layered background material. Non-superlattice structures are an extension of quasi-superlattice materials in that the islands are grown into columns extending vertically through the homogeneous layered background material. These superlattice type structures suffer from the same problems that plague homogeneous crystalline materials. There is very little variation possible in the range of constituents and in the type of superlattices constructed, because of the requirements that the spacing between the layers be approximately the same as that of the equilibrium crystalline constituents. These superlattices are restricted to a very small number of relatively low melting point crystalline materials and the growth rates are constrained by the MBE technique.

In addition to the MBE type of superlattice construction techniques, other researchers have developed layered synthetic microstructures utilizing different forms of vapor deposition, including diode and magnetron sputtering and standard multisource evaporation. The layer dimensions are controlled by shutters or by moving the substrates relative to the material sources or controlling reactive gas partial pressure or with combinations of shutters and relative motion. The materials reported have been formed from crystalline layers, noncrystalline layers and mixtures thereof, however, each of the efforts so far reported is directed at the synthesis of superlattice-type structures by precisely reproducing the deposition conditions on a periodically recurring basis. These materials can be thought of as synthetic crystals or crystal analogues in which it is crucial that the long range periodicity, repetition of a particular combination of layers or grading of layer spacing be maintained. These structures are both structurally and chemically homogeneous in the x-y plane, but are periodic in the third (z) direction. These construction approaches have not been applied to the production of materials with desirable electronic properties, but have only been utilized for specific optical effects.

In addition to the above techniques, compositionally varied materials for a wide range of applications are disclosed in copending Application Ser. No. 422,155, filed Sept. 23, 1982, Compositionally Varied Materials and Method for Synthesizing the Materials, Stanford R. Ovshinsky, which is incorporated herein by reference.

The prior deposition of amorphous silicon, which has been altered by hydrogen from the silane gas in an attempt to make it more closely resemble crystalline silicon and which has been doped in a manner like that of doping crystalline silicon, has characteristics which in all important respects are inferior to those of doped crystalline silicon. Thus, inadequate doping efficiencies and conductivity were achieved especially in the p-type material, and the photovoltaic qualities of these silicon films left much to be desired.

SUMMARY OF THE INVENTION

The non-optimum spectral response of prior art amorphous silicon photoresponsive devices is overcome in accordance with the present invention by inserting one or more band gap adjusting and/or dopants in an amorphous photoresponsive alloy. The alloys can be layered or include the elements in clusters in the photocurrent generation region of the alloy to adjust the band gap to the optimum utilization width for particular applications without substantially increasing the effective deleterious states in the gap. The dopant portions of the alloys can also be layered or clustered to achieve the desired alloys. Thus, the high quality electronic properties of the material are not degraded in forming the new alloy.

The amorphous layered or clustered alloy incorporates at least one density of states reducing element, hydrogen or fluorine. The compensating or altering element or elements can be added during deposition or thereafter. Band gap adjusting element(s) can be activated and may be added in vapor deposition, sputtering or glow discharge processes. The band gap can be adjusted as required for a specific application by introducing the necessary amount of one or more of the adjusting elements into the deposited alloy in at least the photocurrent generation region thereof.

The band gap is adjusted without substantially increasing the effective number of states in the band gap of the alloy and devices, because the layers are deposited thin enough or the clusters small enough to communicate with the surrounding undoped or non-band gap adjusted alloy. The prior silane deposited films typically are deposited on substrates heated to 250° C. to 350° C. to maximize the incorporation and compensation of silicon with hydrogen in the films. The prior attempts to add germanium to these films can fail, because the hydrogen germanium bond is too weak to be stable at the required deposition substrate temperature. The layers or clusters of the invention avoid this problem by surrounding or sandwiching layers or clusters of doped or band gap adjusted layers between layers or portions without dopants or adjusting elements.

The fundamental problem incurred by the previous alloys not containing fluorine is, as is well known, that adding dopants or band gap adjusting elements to homogeneous amorphous silicon alloys creates a very high density of defect states. This high density of defect states substantially degrades the electrical and optical properties, especially the photoresponsive properties, to essentially make the resulting alloys useless for their intended purpose. By utilizing the clusters and layering methods of the invention, dopants and band gap adjusting elements can be introduced into the alloy without deleteriously affecting the properties of the alloy. The layers or clusters of dopants and band gap adjusting elements are made sufficiently thin or small and sandwiched between high quality portions of the alloy materials without any dopants or adjusting elements therein. Thus, the optical and electronic properties of the overall alloy are retained while the band gap and conductivity of the alloy can be adjusted as desired, since the carriers can tunnel right through the thin layers or clusters of the doped or band gap adjusted alloy.

Fluorine can also be added to the alloy of the invention to further enhance the addition of dopants and adjusting elements, such as oxygen, nitrogen, carbon, germanium or tin, added to the layered alloy, because fluorine forms stronger and more stable bonds than does hydrogen. Fluorine compensates or alters silicon as well as the band adjusting element(s) in the alloy more efficiently than hydrogen, because of the stronger more thermally stable bonds and more flexible bonding configurations due to the ionic nature of the fluorine bonding. The use of fluorine produces the alloy or film, described in parent application Ser. No. 884,664, now U.S. Pat. No. 4,217,374, in which the density of states in the band gap are much lower than those produced by a combination of silicon and hydrogen, such as from silane. Since the dopants and band adjusting element(s) can be tailored into the material in layers or clusters without adding substantial deleterious states, because of the influence of fluorine, the new alloy can also maintain high quality electronic qualities and photoconductivity in the adjusted or doped layers.

While the principles of this invention apply to each of the aforementioned deposition processes, for purposes of illustration herein a vapor and a plasma activated vapor deposition environment are described. A glow discharge system is disclosed in U.S. Pat. No. 4,226,898, entitled Amorphous Semiconductors Equivalent to Crystalline Semiconductors, Stanford R. Ovshinsky and Arun Madan, which is incorporated herein by reference, which system has other process variables which advantageously can be utilized with the principles of this invention.

DESCRIPTION OF THE PREFERRED EMBODIMENTS

Figure 1:
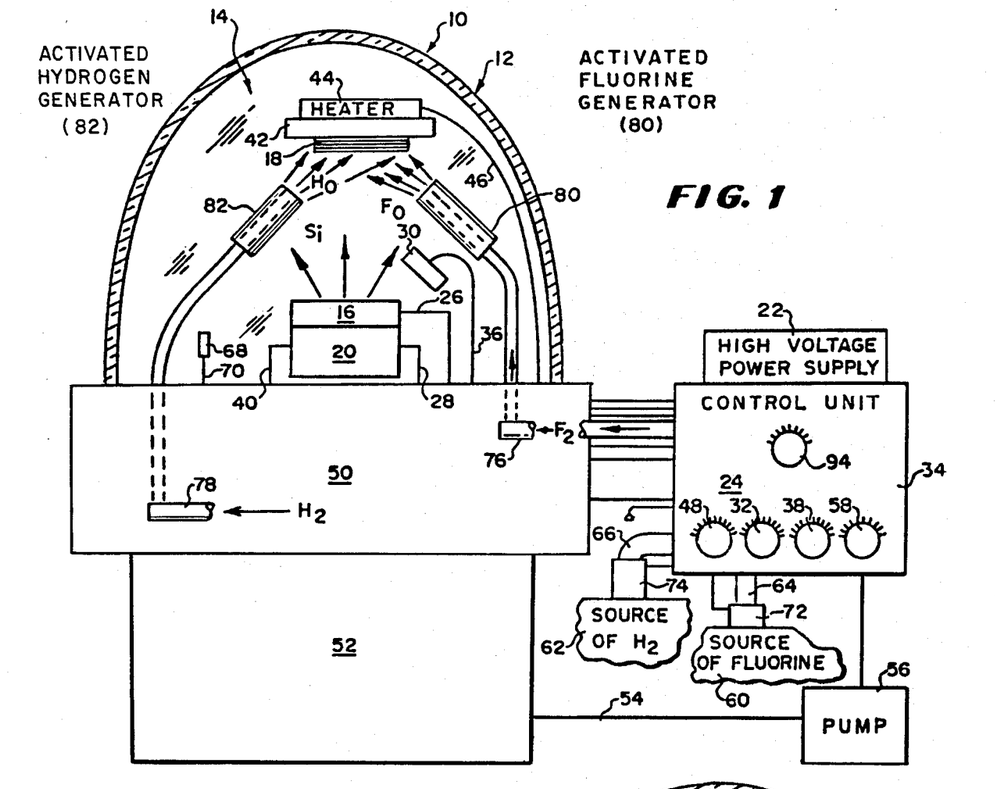
FIG. 1 is a diagrammatic representation of more or less conventional vacuum deposition equipment to which has been added elements for carrying out the addition of fluorine (and hydrogen) by the addition of molecular fluorine or compounds containing fluorine such as $SiF_4$, and hydrogen inlets and activated fluorine and hydrogen generating units which decompose the molecular fluorine and hydrogen within the evacuated space of the vapor deposition equipment, to convert molecular fluorine and hydrogen to activated fluorine and hydrogen and to direct one or both against the substrate during the deposition of an amorphous alloy containing silicon.

Referring now more particularly to FIG. 1, there is shown vapor deposition equipment generally indicated by reference numeral 10, which may be conventional vapor deposition equipment to which is added an activated compensating or altering material injecting means to be described. This equipment, as illustrated, includes a bell jar 12 or similar enclosure enclosing an evacuated space 14 in which is located one or more crucibles 16 containing the amorphous semiconductor film-producing element or elements to be deposited on a substrate 18. In the form of the invention being described, the crucible 16 initially contains silicon for forming an amorphous alloy containing silicon on the substrate 18, which for example, may be a metal, crystalline or polycrystalline semiconductor or other material upon which it is desired to form the alloy to be deposited by the process of the present invention. An electron beam source 20 is provided adjacent to the crucible 16, which electron beam source, diagrammatically illustrated, usually includes a heated filament and beam deflection means (not shown) which directs a beam of electrons at the silicon contained in the crucible 16 to evaporate the same.

A high voltage DC power supply 22 provides a suitable high voltage, for example, 10,000 volts DC, the positive terminal of which is connected through a control unit 24 and a conductor 26 to the crucible 16. The negative terminal is connected through the control unit 24 and a conductor 28 to the filament of the electron beam source 20. The control unit 24 including relays or the like for interrupting the connection of the power supply 22 to the conductors 26 and 28 when the film thickness of an alloy depositing sampling unit 30 in the evacuated space 14 reaches a given value set by operating a manual control 32 on a control panel 34 of the control unit 24. The alloy sampling unit 30 includes a cable 36 which extends to the control unit 24 which includes well known means for responding to both the thickness of the alloy deposited upon the alloy sampling unit 30 and the rate of deposition thereof. A manual control 38 on the control panel 34 may be provided to fix the desired rate of deposition of the alloy controlled by the amount of current fed to the filament of the electron beam source through a conductor 40 in a well known manner.

The substrate 18 is carried on a substrate holder 42 upon which a heater 44 is mounted. A cable 46 feeds energizing current to the heater 44 which controls the temperature of the substrate holder 42 and substrate 18 in accordance with a temperature setting set on a manual control 48 on the control panel 34 of the control unit 24.

The bell jar 12 is shown extending upwardly from a support base 50 from which the various cables and other connections to the components within the bell jar 12 may extend. The support base 50 is mounted on an enclosure 52 to which connects a conduit 54 connecting to a vacuum pump 56. The vacuum pump 56, which may be continuously operated, evacuates the space 14 within the bell jar 12. The desired pressure of the bell jar is set by a control knob 58 on the control panel 34. In this form of the invention, this setting controls the pressure level at which the flow of activated fluorine (and hydrogen) into the bell jar 12 is regulated. Thus, if the control knob is set to a bell jar pressure of $10^{-4}$ torr, the flow of fluorine (and hydrogen) into the bell jar 12 will be such as to maintain such pressure in the bell jar as the vacuum pump 56 continues to operate.

Sources 60 and 62 of molecular fluorine and hydrogen are shown connected through respective conduits 64 and 66 to the control unit 24. A pressure sensor 68 in the bell jar 12 is connected by a cable 70 to the control unit 24. Flow valves 72 and 74 are controlled by the control unit 24 to maintain the set pressure in the bell jar. Conduits 76 and 78 extend from the control unit 24 and pass through the support base 50 into the evacuated space 14 of the bell jar 12. Conduits 76 and 78 respectively connect with activated fluorine and hydrogen generating units 80 and 82 which convert the molecular fluorine and hydrogen respectively to activated fluorine and hydrogen, which may be atomic and/or ionized forms of these gases. The activated fluorine and hydrogen generating units 80 and 82 can be heated tungsten filaments which elevate the molecular gases to their decomposition temperatures or a plasma generating unit well known in the art for providing a plasma of decomposed gases.

The generating units 80 and 82 can be shuttered or otherwise controlled to introduce one or both elements as desired. Also, activated fluorine and hydrogen in ionized forms formed by plasma can be accelerated and injected into the depositing alloy by applying an electric field between the substrate and the activating source. In either event, the activated fluorine and hydrogen generator units 80 and 82 are preferably placed in the immediate vicinity of the substrate 18, so that the relatively short-lived activated fluorine and hydrogen delivered thereby are immediately injected into the vicinity of the substrate 18 where the alloy is depositing. As indicated previously, at least one density of states reducing element, fluorine, can be included in the alloy and hydrogen preferably also will be included. The activated fluorine (and hydrogen) as well as other compensating or altering elements also can be produced from compounds containing the elements instead of from a molecular gas source.

To produce useful amorphous alloys which have the desired characteristics for use in photoresponsive devices such as photoreceptors, solar cells, p-n junction current control devces, etc., the compensating or altering agents, materials or elements produce a very low density of localized states in the energy gap without changing the basic intrinsic character of the film. This result is achieved with relatively small amounts of activated fluorine and hydrogen so that the pressure in the evacuated bell jar space 14 can still be relatively low pressure (like $10^{-4}$ torr). The pressure of the gas in the generator can be higher than the pressure in the bell jar by adjusting the size of the outlet of the generator.

The temperature of the substrate 18 is adjusted to obtain the maximum reduction in the density of the localized states in the energy gap of the amorphous alloy involved. The substrate surface temperature will generally be such that it ensures high mobility of the depositing materials, and preferably one below the crystallization temperature of the depositing alloy.

The surface of the substrate can be irradiated by radiant energy to further increase the mobility of the depositing alloy material, as by mounting an ultraviolet light source (not shown) in the bell jar space 14. Alternatively, instead of the activated fluorine and hydrogen generator units 80 and 82 in FIG. 1, these units can be replaced by an ultraviolet light source 84 shown in FIG. 2, which directs ultraviolet energy against the substrate 18. This ultraviolet light will decompose the molecular fluorine (and hydrogen) both spaced from and at the substrate 18 to form activated fluorine (and hydrogen) which diffuses into the depositing amorphous alloy condensing on the substrate 18. The ultraviolet light also enhances the surface mobility of the depositing alloy material.

Figures 2, 3:
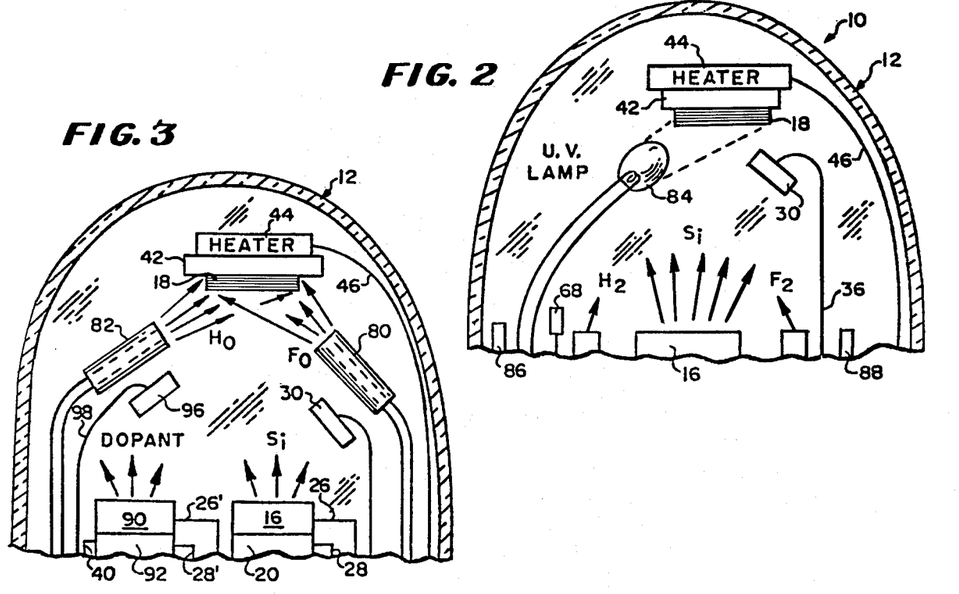
FIG. 2 illustrates vacuum deposition equipment like that shown in FIG. 1, with activated fluorine (and hydrogen) generating means comprising an ultraviolet light source irradiating the substrate during the process of depositing the amorphous alloy, such light source replacing the activated fluorine and hydrogen generator units shown in FIG. 1 and adjusting element generating means.
FIG. 3 illustrates the vacuum deposition equipment of FIG. 1 to which has been added additional means for doping the depositing alloy with an n or p conductivity producing material.

In FIGS. 1 and 2, band gap adjusting elements and dopants can be added in gaseous form in an identical fashion to the fluorine and hydrogen by replacing the hydrogen generator 82 or by adding one or more activated adjusting element generators 86 and 88 (FIG. 2). Each of the generators 86 and 88 typically will be dedicated to one of the band gap adjusting elements or dopants. For example, the generator 86 could supply germanium as in the form of germane gas ($GeH_4$) or boron in the form of diborane gas ($B_2H_6$).

Figures 10, 11, 12:
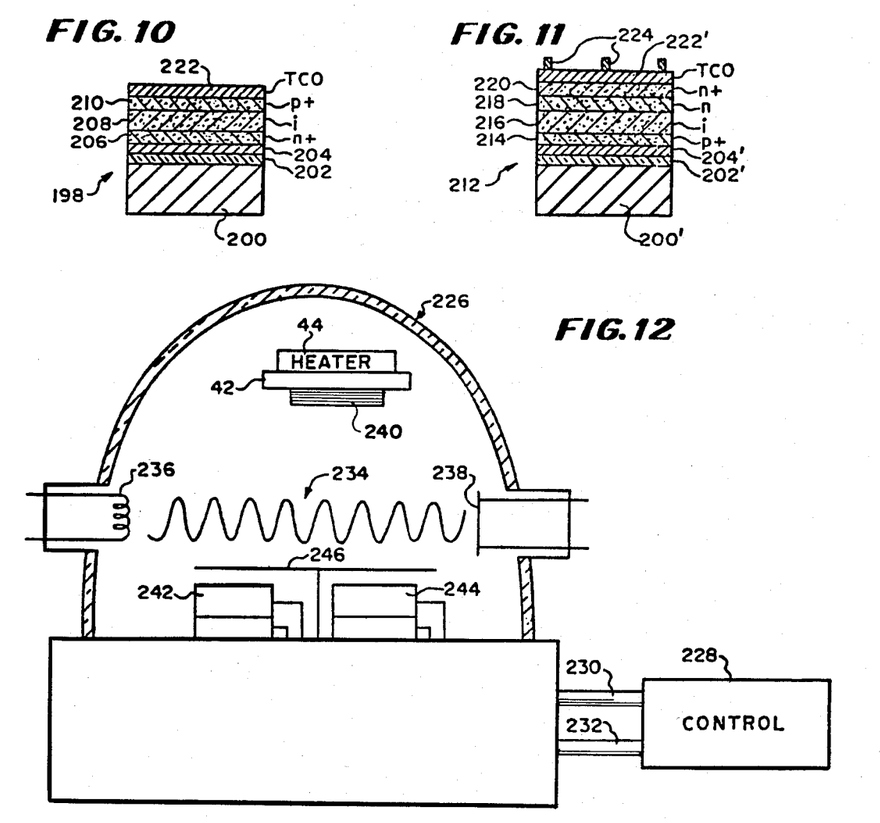
FIG. 10 is a fragmentary sectional view of a p-i-n junction solar cell device.
FIG. 11 is a fragmentary sectional view of an n-i-p junction solar cell device.
FIG. 12 is a diagrammatic representation of a plasma activated vapor deposition system for depositing the layered or clustered amorphous alloys of the inventon with dopants or adjusting elements incorporated therein.

Referring now to FIG. 3, it illustrates additions to the equipment shown in FIG. 1 for adding dopants or adjusting elements to the depositing alloy. For example, an n-conductivity dopant, like phosphorus or arsenic, can be added to make the intrinsically modest n-type alloy a more substantially n-type alloy, and then a p-dopant like boron, aluminum, gallium or indium may be added to form a good p-n junction within the alloy. A crucible 90 is shown for receiving a dopant like arsenic which is evaporated by bombarding the same with an electron beam source 92, like the beam source 20 previously described. The rate at which the dopant evaporates into the atmosphere of the bell jar 12, which is determined by the intensity of the electron beam produced by the electron beam source 92, is set by a manual control 94 on the control panel 34, which controls the current fed to the filament forming part of this beam source to produce the set evaporation rate. The evaporation rate is measured by a thickness sampling unit 96 upon which the dopant material deposits and which generates a signal on a cable 98 extending between the unit 96, and control unit 24, which indicates the rate at which the dopant material is deposited on the unit 96. The dopants and adjusting elements can be added in clusters or layers by controlling the electron beam source 92 or by shutters as illustrated in FIG. 12. The dopants or adjusting elements can be inserted as layers or clusters by the relative time the source is operated.

After the desired thickness of layered or clustered amorphous alloy having the desired degree of n-conductivity has been deposited, evaporation of silicon and the n-conductivity dopant is terminated and the crucible 90 (or another crucible not shown) is provided with a p-conductivity dopant described, and the amorphous alloy and dopant deposition process then proceeds as before to increase the thickness of the layered or clustered amorphous alloy with a plurality of p-conductivity regions therein.

The band gap adjusting element(s) also can be added by a similar process to that described for the dopants by utilizing another crucible similar to the crucible 90.

In the case where the amorphous alloys comprise two or more elements which are solid at room temperature, then it is usually desirable to separately vaporize each element placed in a separate crucible, and control the deposition rate thereof in any suitable manner, as by shutters or by setting controls on the control panel 34 which, in association with the deposition rate and thickness sampling units, controls the thickness and composition of the depositing alloy.

Figure 4:
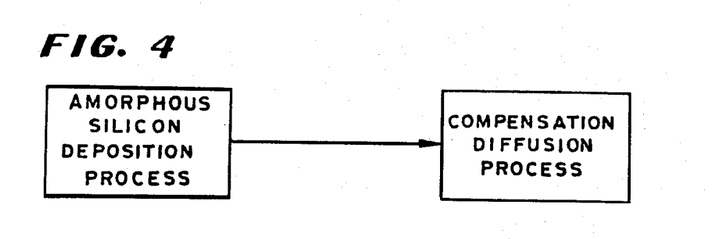
FIG. 4 illustrates an application wherein the deposition of the amorphous alloy and the application of the activated fluorine and hydrogen may be carried out as separate steps and in separate enclosures.
Figure 5:
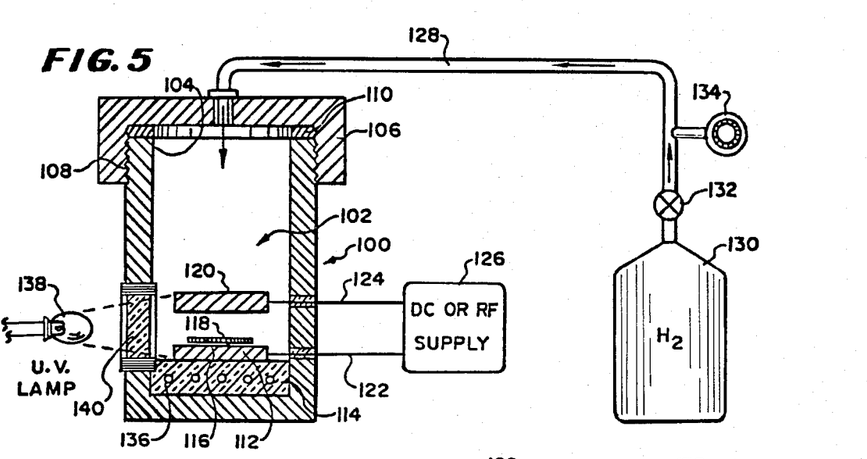
FIG. 5 illustrates exemplary apparatus for diffusing activated hydrogen into a previously deposited amorphous alloy.

As previously indicated, although it is preferred that compensating and other agents be incorporated into the amorphous alloy as it is deposited, in accordance with another aspect of the invention, the amorphous alloy deposition process and the process of injecting the compensating and other agents into the semiconductor alloy can be done in a completely separate environment from the depositing of the amorphous alloy. This can have an advantage in certain applications since the conditions for injecting such agents are then completely independent of the conditions for the alloy deposition. Also, as previously explained, if the vapor deposition process produces a porous alloy, the porosity of the alloy, in some cases, is more easily reduced by environmental conditions quite different from that present in the vapor deposition process. To this end, reference should now be made to FIGS. 4 and 5 which illustrate that the amorphous deposition process and the compensating or altering agent diffusion process are carried out as separate steps in completely different environments, FIG. 5 illustrating apparatus for carrying out the post compensation diffusion process.

As there is shown, a low pressure container body 100 is provided which has a low pressure chamber 102 having an opening 104 at the top thereof. This opening 104 is closed by a cap 106 having threads 108 which thread around a corresponding threaded portion on the exterior of the container body 100. A sealing O-ring 110 is sandwiched between the cap 106 and the upper face of the container body. A sampleholding electrode 112 is mounted on an insulating bottom wall 114 of the chamber 100. A substrate 116 upon which an amorphous semiconductor alloy 118 has already been deposited is placed on the electrode 112. The upper face of the substrate 116 contains the amorphous alloy 118 to be altered or compensated in the manner now to be described.

Spaced above the substrate 116 is an electrode 120. The electrodes 112 and 120 are connected by cables 122 and 124 to a DC or RF supply source 126 which supplies a voltage between the electrodes 112 and 120 to provide an activated plasma of the compensating or altering gas or gases, such as fluorine, hydrogen, and the like, fed into the chamber 102. For purposes of simplicity, FIG. 5 illustrates only molecular hydrogen being fed into the chamber 102 by an inlet conduit 128 passing through the cap 106 and extending from a supply tank 130 of molecular hydrogen. Other compensating or altering gases (such as fluorine and the like) also may be similarly fed into the chamber 102. The conduit 128 is shown connected to a valve 132 near the tank 130.

A flow rate indicating gauge 134 is shown connected to the inlet conduit 128 beyond the valve 132.

Suitable means are provided for heating the interior of the chamber 102 so that the substrate temperature is elevated preferably to a temperature below, but near the crystallization temperature of the film 118. For example, coils of heating wire 136 are shown in the bottom wall 114 of the chamber 102 to which coils connect a cable (not shown) passing through the walls of the container body 100 to a source of current for heating the same.

The high temperature together with a plasma of gas containing one or more compensating elements developed between the electrodes 112 and 120 achieve a reduction of the localized states in the band gap of the alloy. The compensating or altering of the amorphous alloy 118 may be enhanced by irradiating the amorphous alloy 118 with radiant energy from an ultraviolet light source 138, which is shown outside of the container body 100 directing ultraviolet light between the electrodes 112 and 120 through a quartz window 140 mounted in the side wall of the container body 100.

The low pressure or vacuum in the chamber 102 can be developed by a vacuum pump (not shown) such as the pump 56 in FIG. 1. The pressure of the chamber 102 can be on the order of 0.3 to 2 Torr with a substrate temperature on the order of 200° to 450° C. The activated fluorine (and hydrogen) as well as other compensating or altering elements also can be produced from compounds containing the elements instead of from a molecular gas source, as previously mentioned.

Figure 6:
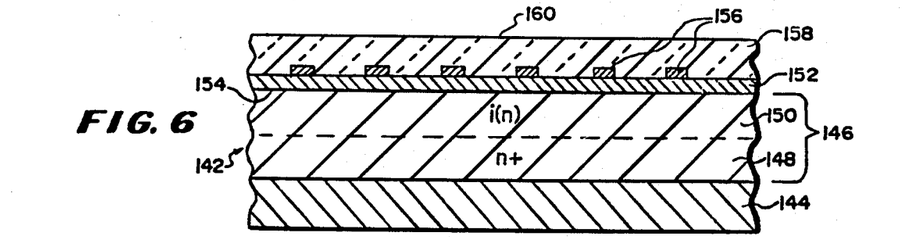
FIG. 6 is a fragmentary sectional view of an embodiment of a Schottky barrier solar cell to illustrate one application of the amorphous semiconductor photoreceptive alloys made by the process of the invention.

Various applications of the improved layered or clustered amorphous alloys produced by the unique processes of the invention are illustrated in FIGS. 6 through 11. FIG. 6 shows a Schottky barrier solar cell 142 in fragmentary cross section. The solar cell 142 includes a substrate or electrode 144 of a material having good electrical conductivity properties, and the property of making an ohmic contact with an amorphous alloy 146 compensated or altered to provide a low density of localized states in the energy gap and with a band gap optimized by the processes of the present invention. The substrate 144 may comprise a low work function metal, such as aluminum, tantalum, stainless steel or other material matching with the amorphous alloy 146 deposited thereon which preferably includes silicon. It is most preferred that the alloy have a region 148 next to the electrode 144, which region forms an n-plus conductivity, heavily doped, low resistance interface between the electrode and an undoped relatively high dark resistance region 150 which is an intrinsic, but low n-conductivity region. The region 148 can include the n-type dopants in layers and/or clusters to incorporate the advantages of the invention.

The upper surface of the amorphous alloy 146, as viewed in FIG. 6, joins a metallic region 152, the interface between this metallic region and the amorphous alloy 146 forming a Schottky barrier 154. The metallic region 152 is transparent or semi-transparent to solar radiation, has good electrical conductivity and is of a high work function (for example, 4.5 eV or greater, produced, for example, by gold, platinum, palladium, etc.) relative to that of the amorphous alloy 146. The metallic region 152 may be a single layer of a metal or it may be a multi-layer. The amorphous alloy 146 may have a thickness of about 0.5 to 1 micron and the metallic region 152 may have a thickness of about 100Å in order to be semi-transparent to solar radiation.

On the surface of the metallic region 152 is deposited a grid electrode 156 made of a metal having good electrical conductivity. The grid can comprise orthogonally related lines of conductive material occupying only a minor portion of the area of the metallic region, the rest of which is to be exposed to solar energy. For example, the grid 156 may occupy only about from 5 to 10% of the entire area of the metallic region 152. The grid electrode 156 uniformly collects current from the metallic region 152 to assure a good low series resistance for the device.

An anti-reflection layer 158 may be applied over the grid electrode 156 and the areas of the metallic region 152 between the grid electrode areas. The anti-reflection layer 158 has a solar radiation incident surface 160 upon which impinges the solar radiation. For example, the anti-reflection layer 158 may have a thickness on the order of magnitude of the wavelength of the maximum energy point of the solar radiation spectrum, divided by four times the index of refraction of the anti-reflection layer 158. If the metallic region 152 is platinum of 100Å in thickness, a suitable anti-reflection layer 158 would be zirconium oxide of about 500Å in thickness with an index of refraction of 2.1.

The band gap adjusting element(s) can be added to the photocurrent generating region 150 also in layers and/or clusters. The Schottky barrier 154 formed at the interface between the regions 150 and 152 enables the photons from the solar radiation to produce current carriers in the alloy 146, which are collected as current by the grid electrode 156. An oxide layer (not shown) can be added between the layers 150 and 152 to produce an MIS (metal insulator semiconductor) solar cell.

In addition to the Schottky barrier or MIS solar cell shown in FIG. 6, there are solar cell constructions which utilize p-n junctions in the body of the amorphous alloy forming a part thereof formed in accordance with successive deposition, compensating or altering and doping steps like that previously described. These other forms of solar cells are generically illustrated in FIG. 7 as well as in FIGS. 10 and 11.

Figure 7:
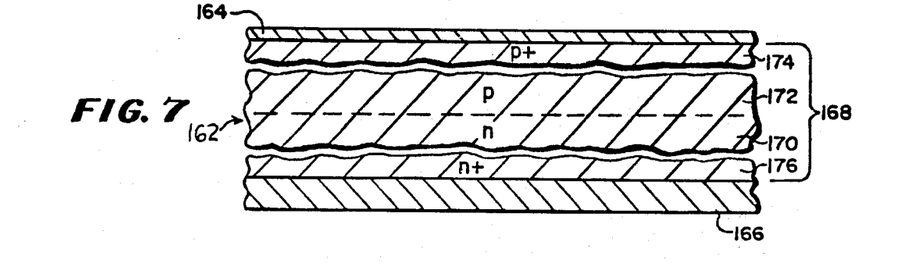
FIG. 7 is a fragmentary sectional view of a p-n junction solar cell device which includes a doped amorphous semiconductor alloy made by the process of the invention.

These constructions 162 generally include a transparent electrode 164 through which the solar radiation energy penetrates into the body of the solar cell involved. Between this transparent electrode and an opposite electrode 166 is a deposited amorphous alloy 168, preferably including silicon, initially compensated in the manner previously described. In this amorphous alloy 168 are at least two adjacent regions 170 and 172 where the amorphous alloy has respectively oppositely doped regions, region 170 being shown as a n-conductivity region and region 172 being shown as a p-conductivity region. The doping of the regions 170 and 172 by layering and/or clusters is only sufficient to move the Fermi levels to the valence and conduction bands involved so that the dark conductivity remains at a low value achieved by the band adjusting and compensating or altering method of the invention. The alloy 168 has high conductivity, highly doped ohmic contact interface regions 174 and 176 of the same conductivity type as the adjacent region of the alloy 168. The alloy regions 174 and 176 contact electrodes 164 and 166, respectively. The band gap adjusting element(s) can be added in layers and/or clusters to regions 170, 172, 174 and/or 176 as desired.

Figure 8:
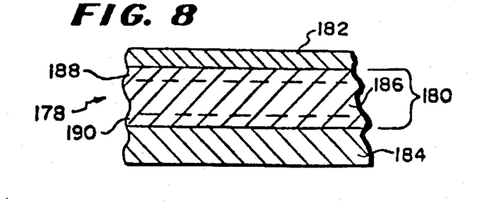
FIG. 8 is a fragmentary sectional view of a photodetection device which includes an amorphous semiconductor alloy made by the process of the invention.

Referring now to FIG. 8, there is illustrated another application of an amorphous alloy utilized in a photodetector device 178 whose resistance varies with the amount of light impinging thereon. An amorphous layered and/or clustered alloy 180 thereof can be band gap adjusted, doped and compensated or altered in accordance with the invention, which has no p-n junctions as in the embodiment shown in FIG. 7 and is located between a transparent electrode 182 and a substrate electrode 184. In a photo-detector device it is desirable to have a minimum dark conductivity and so the amorphous alloy 180 has an undoped, but compensated or altered region 186 and heavily doped layered regions 188 and 190 of the same conductivity type forming a low resistance ohmic contact with the electrodes 182 and 184, which may form a substrate for the alloy 180. The band gap adjusting element(s) can be added in layers and/or clusters to the regions 186, 188 and 190 as desired.

Figure 9:
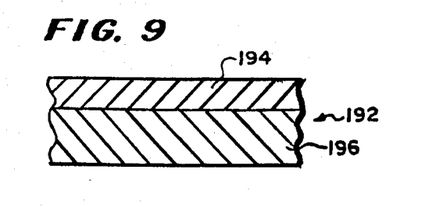
FIG. 9 is a fragmentary sectional view of a xerographic drum including an amorphous semiconductor alloy made by the process of the invention.

Referring to FIG. 9, an electrostatic image producing device 192 (like a xerography drum) is illustrated. The device 192 has a low dark conductivity, selective wavelength threshold, undoped or slightly p-doped amorphous alloy 194 deposited on a suitable substrate 196 such as a drum. The band gap adjusting element(s) and dopants can be added to the alloy 194 as desired.

As used herein, the terms compensating agents or materials and altering agents, elements or materials mean materials which are incorporated in the amorphous alloy for altering or changing the structure thereof, such as activated fluorine (and hydrogen) incorporated in the amorphous alloy containing silicon to form an amorphous silicon/fluorine/hydrogen composition alloy, having a desired band gap and a low density of localized states in the energy gap. The activated fluorine (and hydrogen) is bonded to the silicon in the alloy and reduces the density of localized states therein and due to the small size of the fluorine and hydrogen atoms they are both readily introduced into the amorphous alloy without substantial dislocation of the silicon atoms and their relationships in the amorphous alloy. This is true most particularly because of the extreme electronegativity, specificity and reactivity of fluorine. All of these characteristics organize the local order of the alloys through the inductive powers of fluorine. The ability of fluorine to bond with both silicon and hydrogen results in the formation of alloys with a minimum of localized defect states in the energy gap. Hence, fluorine and hydrogen are introduced without substantial formation of other localized states in the energy gap which alloys can also be utilized as the material between doped or adjusted and hence somewhat degraded layers or clusters.

Referring now to FIG. 10, a p-i-n solar cell 198 is illustrated having a substrate 200 which may be glass or a flexible web formed from polymers, glass, stainless steel or aluminum. The substrate 200 is of a width and length as desired and preferably at least 3 mils thick. Conducting substrates can have an insulating layer 202 deposited thereon by a conventional process such as chemical deposition, vapor deposition, or anodizing in the case of an aluminum substrate. The layer 202 for instance, is about 5 microns thick and can be made of a metal oxide. For an aluminum substrate, it preferably is aluminum oxide ($Al_2O_3$) and for a stainless steel substrate it may be silicon dioxide ($SiO_2$) or other suitable glass. A conductive substrate can be utilized without an insulating layer when forming cells in parallel or for individual cells.

An electrode 204 is deposited in one or more layers upon the layer 202 to form a base electrode for the cell 198. The electrode 204 layer or layers is deposited by vapor deposition, which is a relatively fast deposition process. The electrode layers preferably are reflective metal electrodes of molybdenum, aluminum, chrome or stainless steel for a solar cell or a photovoltaic device. The reflective electrode is preferable since, in a solar cell, non-absorbed light which passes through the semiconductor alloy is reflected from the electrode layers 204 where it again passes through the semiconductor alloy which then absorbs more of the light energy to increase the device efficiency.

The substrate 200 is then placed in the deposition environment. The specific examples shown in FIGS. 10 and 11 are illustrative of some p-i-n junction devices which can be manufactured utilizing the improved methods and materials of the invention. Each of the devices illustrated in FIGS. 10 and 11, has an alloy body having an overall thickness of between about 3,000 and 30,000 angstroms. This thickness ensures that there are no pin holes or other physical defects in the structure and that there is maximum light absorption efficiency. A thicker material may absorb more light, but at some thickness will not generate more current since the greater thickness allows more recombination of the light generated electron-hole pairs. (It should be understood that the thicknesses of the various layers shown in FIGS. 6 through 11 are not drawn to scale.)

Referring first to forming the n-i-p device 198, the device is formed by first depositing a heavily doped layered n+ alloy layer 206 on the electrode 204. Once the n+ layer 206 is deposited, an intrinsic (i) alloy layer 208 is deposited thereon. The intrinsic layer 208 is followed by a highly doped layered conductive p+ alloy layer 210 deposited as the final semiconductor layer. The alloy layers 206, 208 and 210 form the active layers of the n-i-p device 198.

While each of the devices illustrated in FIGS. 10 and 11 may have other utilities, they will be now described as photovoltaic devices. Utilized as a photovoltaic device, the selected outer, p+ layer 210 is a low light absorption, high conductivity alloy layer. The intrinsic alloy layer 208 preferably is layered or clustered to have an adjusted wavelength threshold for a solar photoresponse, high light absorption, low dark conductivity and high photoconductivity including sufficient amounts of the adjusting element(s) to optimize the band gap. The bottom alloy layer 204 including clusters or layers is a low light absorption, high conductivity n+ layer. The overall device thickness between the inner surface of the electrode layer 206 and the top surface of the p+ layer 210 is, as stated previously, on the order of at least about 3,000 angstroms. The thickness of the n+ doped layer 206 is preferably in the range of about 50 to 500 angstroms. The thickness of the amorphous adjusting element containing intrinsic alloy 208 is preferably between about 3,000 angstroms to 30,000 angstroms. The thickness of the top layered p+ contact layer 210 also is preferably between about 50 to 500 angstroms. Due to the shorter diffusion length of the holes, the p+ layer generally will be as thin as possible on the order of 50 to 150 angstroms. Further, the outer layer (here p+ layer 210) whether n+ or p+ will be kept as thin as possible to avoid absorption of light in that contact layer, and can also include the band gap adjusting element(s).

A second type of p-i-n junction device 212 is illustrated in FIG. 11. In this device a first layered or clustered p+ layer 214 is deposited on the electrode layer 204' followed by an intrinsic amorphous alloy layer 216 containing the band gap adjusting element(s) layered and/or clustered in the desired amounts, a layered or clustered n amorphous alloy layer 218 and an outer clustered or layered n+ amorphous alloy layer 220. Further, although the intrinsic alloy layer 208 or 216 (in FIGS. 10 and 11) is an amorphous alloy the other layers are not so restricted and may be polycrystalline, such as layer 214. (The inverse of the FIGS. 10 and 11 structure not illustrated, also can be utilized.) Further, not all the dopants and adjusting elements need be introduced in layers or clusters and they can be combinations of both layers and clusters in the same or different material type regions.

Following the deposition of the various semiconductor alloy layers in the desired order for the devices 198 and 212, a further deposition step is performed, preferably in a separate deposition environment. Desirably, a vapor deposition environment is utilized since it is a fast deposition process. In this step, a TCO layer 222 (transparent conductive oxide) is added which, for example, may be indium tin oxide (ITO), cadmium stannate ($Cd_2SnO_4$), or doped tin oxide ($SnO_2$). The TCO layer will be added following the post compensation of fluorine (and hydrogen) if the films were not deposited with one or more of the desired compensating or altering elements therein.

An electrode grid 224 can be added to either of the devices 198 or 212 if desired. For a device having a sufficiently small area, the TCO layer 222 is generally sufficiently conductive such that the grid 224 is not necessary for good device efficiency. If the device is of a sufficiently large area or if the conductivity of the TCO layer 222 is insufficient, the grid 224 can be placed on the layer 222 to shorten the carrier path and increase the conduction efficiency of the devices.

Referring now to FIG. 12, one embodiment of a plasma activated vapor deposition chamber 226 is illustrated in which the semiconductor, dopants and band adjusting element(s) of the invention can be deposited. A control unit 228 is utilized to control the depositing parameters, such as pressure, flow rates, etc., in a manner similar to that previously described with respect to the unit 24 (FIG. 1). The pressure would be maintained at about $10^{-3}$ Torr or less.

One or more reaction gas conduits, such as 230 and 232, can be utilized to supply gases containing reducing elements such as silicon tetrafluoride ($SiF_4$) and hydrogen ($H_2$) or containing dopants such as diborane ($B_2H_6$) into a plasma region 234. The plasma region 234 is established between a coil 236 fed by a DC power supply (not illustrated) and a plate 238. The plasma activates the supply gas or gases to supply activated fluorine (and hydrogen) to be deposited on a substrate 240. The substrate 240 may be heated to the desired deposition temperature by heater means as previously described. Any method of activation or generating free radicals is contemplated, such as the utilization of microwave or ultraviolet energy or heated wires.

The band gap adjusting element(s), dopants and silicon can be added from two or more evaporation boats, such as 242 and 244. The boat 242 could for example contain germanium and the boat 244 would contain silicon or the boat 242 could include aluminum or another dopant. The elements in boats 242 and 244 can be evaporated by electron beam or other heating means and are activated by the plasma.

To introduce the dopants and band gap adjusting element(s) into the film being deposited in layers and/or clusters, one or more shutters 246 can be utilized. The shutter could rotate layering or clustering separate band adjusting elements or dopants from two or more of the boats or can be utilized to control the depositing of the band adjusting element or dopants from the boat 242 (or others) to provide layers and/or clusters in the film or to vary the amount of dopants and band adjusting element deposited in the film. Thus, the dopants and band adjusting element(s) can be added discretely in layers, in substantially constant or in varying amounts as desired.

Figure 13:
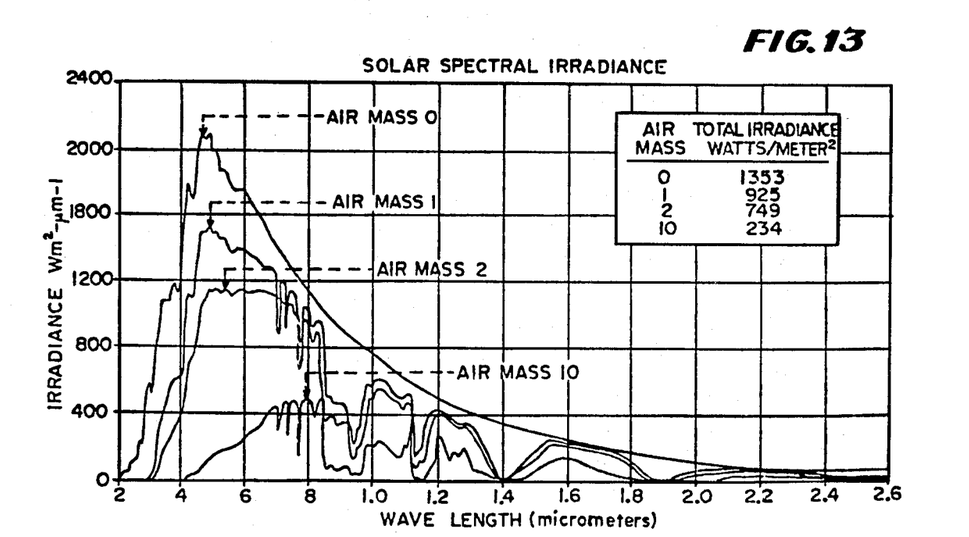
FIG. 13 is a solar spectral irradiance chart illustrating the standard sunlight wavelengths available for various photoresponsive applications.

FIG. 13 illustrates the available sunlight spectrum, Air Mass 0 (AM0) being the sunlight available with no atmosphere and the sun directly overhead. AM1 corresponds to the same situation after filtering by the earth's atmosphere. Crystalline silicon has an indirect band gap of about 1.1 to 1.2 eV, which corresponds to the wavelength of about 1.0 micrometer (microns). This equates to losing, i.e. not generating useful photons, for substantially all the light wavelengths above 1.0 microns. As utilized herein, band gap or E optical is defined as the extrapolated intercept of a plot of $(\alpha\hbar\omega)^{\frac{1}{2}}$, where $\alpha$ is the absorption coefficient and $\hbar\omega$ (or e) is the photon energy. For light having a wavelength above the threshold defined by the band gap, the photon energies are not sufficient to generate a photocarrier pair and hence do not add any current to a specific device.

Calculations for the maximum theoretical conversion efficiency as a function of the width of the band gap were done by J. J. Loferski, as reported in *Journal of Applied Physics*, Vol. 27, p. 777, July 1956. For single band gap materials, depending upon the assumptions made, the optimum band gap is on the order of 1.4 to 1.5 eV for solar applications. To produce the desired photovoltaic band gap of 1.5 eV in the amorphous devices the band adjusting element(s) of the invention, such as germanium, are added to the photogenerating regions by layering or clusters, as previously described.

Another photoresponsive application is for laser wavelengths such as for infrared response. A photoresponsive material used in a high speed xerographic computer output device utilizing a laser, such as a helium neon laser, should have a wavelength threshold about 0.6 microns. For fiber optic use, such as with GaAs lasers, the photoresponsive material threshold should be about one micron or below. The addition of the band gap adjusting element(s) in layers and/or clusters allows the tailoring of alloys having the optimum band gap for the desired application.

Each of the device semiconductor alloy layers can be glow discharge deposited upon the base electrode substrate by a conventional glow discharge chamber described in the aforesaid U.S. Pat. No. 4,226,898. The layered and/or clustered alloy also can be deposited in a continuous process, such as described in copending U.S. application Ser. No. 151,301, A Method of Making P-Doped Silicon Films and Devices Made Therefrom, filed in the names of Masatsugu Izu, Vincent D. Cannella and Stanford R. Ovshinsky, on May 19, 1980, now U.S. Pat. No. 4,400,409. In these cases, the glow discharge system initially is evacuated to approximately 1 Torr to purge or eliminate impurities in the atmosphere from the deposition system. The alloy material preferably is then fed into the deposition chamber in a compound gaseous form, most advantageously as silicon tetrafluoride ($SiF_4$), hydrogen ($H_2$) and germane ($GeH_4$) for decreasing the band gap and diborane ($B_2H_6$) for doping. The glow discharge plasma preferably is obtained from the gas mixture. The deposition system in U.S. Pat. No. 4,226,898 preferably is operated at a pressure in the range of about 0.3 to 1.5 Torr, preferably between 0.6 to 1.0 Torr such as about 0.6 Torr.

The semiconductor material is deposited from a self-sustained plasma onto the substrate which is heated, preferably by infrared means, to the desired deposition temperature for each alloy layer. The dopants are layered and/or added in clusters into the device and are deposited at various temperatures in the range of 200° C. to about 1000° C., depending upon the form of the material used. The upper limitation on the substrate temperature in part is due to the type of substrate utilized. For aluminum the upper temperature should not be above about 600° C. and for stainless steel it could be above about 1000° C. while flexible webs of glass have various upper limits. For an initially hydrogen compensated amorphous alloy to be produced, such as to form the intrinsic layer in n-i-p or p-i-n devices, the substrate temperature should be less than about 400° C. and preferably about 300° C.

The doping concentrations are varied to produce the desired p, $p^+$, n or $n^+$ type conductivity as the layered alloys are deposited for each device. For n or p doped layers, the material is doped with 5 to 100 ppm of dopant material as it is deposited. For $n^+$ or $p^+$ doped layers the material is doped with 100 ppm to over 1 percent of dopant material as it is deposited. The n dopant material can be conventional dopants or the method and materials described in U.S. Ser. No. 151,301 deposited at the respective substrate temperatures preferably in the range of 100 ppm to over 5000 ppm for the $p^+$ material.

The glow discharge deposition process in U.S. Ser. No. 151,301 includes an AC signal generated plasma into which the materials are introduced. The plasma preferably is sustained between a cathode and substrate anode with an AC signal of about 1 kHz to 13.6 MHz.

Although the dopants and band gap adjusting element(s) can be layered and/or clustered into devices with various amorphous alloy layers, it is preferable that they are utilized with one of the fluorine and hydrogen compensated glow discharge deposited alloys. In this case, a mixture of silicon tetrafluoride and/or hydrogen or silane is deposited as an amorphous compensated alloy material at or below about 400° C., for the n-type layer. The band gap adjusted intrinsic amorphous alloy layer and the $p^+$ layer can be deposited upon the electrode layer at a higher substrate temperature above about 450° C. which will provide a compensated material.

For example, a mixture of the gases $GeH_4 + Ar + SiF_4 + H_2$ having relative percentage of $GeH_4$ to $SiF_4$ in the range of 0.001 to 1% produces photoresponsive alloys having the desired band gaps without losing the desired electronic properties. The mixture has a ratio of $SiF_4$ to $H_2$ of 4 to 1 to 10 to 1. The amount of the adjusting element(s), here germanium, in the resulting alloy is much greater than the gas percentages and can be significantly above twenty percent depending upon the application. Argon is useful as a diluent but is not essential to the process of the invention.

Although the band gap adjusting element(s) are layered and/or introduced in clusters at least into the photoresponsive region of the devices, the element(s) also can have utility in the other alloy layers of the devices. As previously mentioned, the alloy layers other than the intrinsic alloy layer can be other than amorphous layers, such as polycrystalline layers. (By the term "amorphous" is meant an alloy or material which has long range disorder, although it may have short or intermediate order or even contain at times some crystalline inclusions).

Modifications and variations of the present invention are possible in light of the above teachings. It is therefore, to be understood that within the scope of the appended claims the invention may be practiced otherwise than as specifically described.

What is claimed and desired to be secured by Letters Patent of the United States is:

1. A method of making an improved photoresponsive amorphous alloy, said method comprising depositing on a substrate a material including at least silicon and incorporating in said material at least one density of states reducing element and introducing at least one dopant or band gap adjusting element into said material without substantially increasing the effective states in the band gap to produce an optimized alloy, at least one portion of said material being formed with a plurality of substantially discrete subportions therein.

2. The method as defined in claim 1 wherein said alloy has a band gap adjusted for a specified photoresponse wavelength threshold, said band gap adjusting element being germanium.

3. The method as defined in claim 2 wherein said alloy is glow discharge deposited from at least a mixture of a gaseous compound containing at least Ge and said at least one density of states reducing element.

4. The method as defined in claim 3 wherein said mixture includes up to one percent $GeH_4$.

5. An amorphous alloy made by the process of claim 4.

6. An amorphous alloy made by the process of claim 3.

7. An amorphous alloy made by the process of claim 2.

8. The method as defined in claim 1 wherein said density of states reducing element is fluorine.

9. The method as defined in claim 8 further including introducing a second density of states reducing element, said second element being hydrogen.

10. The method as defined in claim 9 wherein both said density of states reducing elements are incorporated into said depositing alloy substantially simultaneously with said band gap adjusting element.

11. An amorphous alloy made by the process of claim 8.

12. The method as defined in claim 1 wherein said density of states reducing element is hydrogen.

13. The method as defined in claim 12 further including introducing a second density of states reducing element, said second element being fluorine.

14. The method as defined in claim 13 wherein both said density of states reducing elements are incorporated into said depositing alloy substantially simultaneously with said band gap adjusting element.

15. The method as defined in claim 1 wherein said alloy is deposited with an active photoresponsive region therein and said band gap adjusting element is introduced at least in said region.

16. The method as defined in claim 1 wherein said method forms one step in a multi-step process for forming successively deposited alloy layers of opposite (p and n) conductivity type, the n-type layer being formed by introducing during the deposition of the layer an n-dopant element which is deposited with the deposited layer to produce an n-type layer and the p-type layer being formed by introducing during deposition of the layer a p-dopant element which is deposited with the deposited layer to produce a p-type layer.

17. The method as defined in claim 16 wherein there is deposited between said p and n doped layers an intrinsic amorphous alloy layer without a p or n dopant element present therein, at least a portion of said intrinsic layer containing said band gap adjusting element.

18. The method as defined in claim 16 wherein at least one of said opposite conductivity type layers is introduced into said alloy in substantially discrete layers.

19. An amorphous alloy made by the process of claim 18.

20. The method as defined in claim 16 wherein at least one of said opposite conductivity type layers is introduced into said alloy in varying amounts.

21. An amorphous alloy made by the process of claim 20.

22. The method as defined in claim 16 wherein at least one of said opposite conductivity type layers is introduced into said alloy with substantially discrete clusters therein.

23. The method as defined in claim 1 wherein said dopant element is incorporated into said alloy in substantially discrete layers.

24. An amorphous alloy made by the process of claim 14.

25. The method as defined in claim 1 wherein said band gap adjusting element is introduced into said alloy in substantially discrete layers.

26. An amorphous alloy made by the process of claim 25.

27. The method as defined in claim 1 wherein said band gap adjusting element is introduced into said alloy in varying amounts.

28. An amorphous alloy made by the process of claim 27.

29. The method as defined in claim 1 wherein said dopant element is introduced into said alloy in varying amounts.

30. An amorphous alloy made by the process of claim 29.

31. The method as defined in claim 1 wherein said dopant is incorporated into said alloy in substantially discrete clusters.

32. The method as defined in claim 1 wherein said band gap adjusting element is incorporated into said alloy in substantially discrete clusters.

33. The method as defined in claim 1 including evaporating said band gap adjusting element prior to introducing it into said alloy.

34. The method as defined in claim 33 including plasma activating said adjusting element as it is being introduced into said alloy.

35. The method as defined in claim 34 including activating said adjusting element by plasma activated vapor deposition.

36. The method as defined in claim 1 wherein said method includes depositing at least a portion of said alloy with one of a p or n dopant element therein to form a p or n conductivity type alloy.

37. The method as defined in claim 1 wherein said discrete subportions are formed in layers.

38. The method as defined in claim 1 wherein said discrete subportions are formed in clusters.

39. An amorphous alloy made by the process of claim 1.

40. An improved photoresponsive amorphous alloy, said alloy including silicon and incorporating at least one density of states reducing element therein, said alloy having one of a band gap adjusting element or dopant incorporated therein without substantially increasing the effective states in the gap, at least a portion of said alloy being formed with a plurality of substantially discrete subportions therein.

41. The alloy as defined in claim 40 wherein said alloy includes a band gap adjusted for a specified photoresponse wavelength threshold, and said band gap adjusting element is germanium.

42. The alloy in claim 40 wherein said alloy has an active photoresponsive region therein and said adjusting element is included at least in said region.

43. The alloy as defined in claim 40 wherein said density of states reducing element is fluorine.

44. The alloy as defined in claim 43 further including a second density of states reducing element incorporated therein, said element being hydrogen.

45. The alloy as defined in claim 40 wherein said density of states reducing element is hydrogen.

46. The alloy as defined in claim 45 further including a second density of states reducing element incorporated therein, said element being fluorine.

47. The alloy as defined in claim 40 deposited by glow discharge deposition.

48. The alloy as defined in claim 40 including said adjusting element in substantially discrete layers.

49. The alloy as defined in claim 40 including said dopant in substantially discrete layers.

50. The alloy as defined in claim 40 including said adjusting element in substantially discrete clusters.

51. The alloy as defined in claim 40 including said dopant in substantially discrete clusters.

52. The alloy as defined in claim 40 including said adjusting element in varying amounts.

53. The alloy as defined in claim 40 including said dopant in varying amounts.

54. The alloy as defined in claim 40 including at least one of an n or p conductivity portion therein; said portion including an n or p dopant element therein.

55. The alloy as defined in claim 54 wherein at least one of said n or p conductivity portions is formed in substantially discrete layers.

56. The alloy as defined in claim 54 wherein at least one of said n or p conductivity portions is formed with substantially discrete clusters therein.

57. The alloy as defined in claim 54 wherein at least one of said n or p conductivity portions is formed with varying amounts of dopants therein.

58. An improved photoresponsive device, said device comprising superimposed layers of various materials including an amorphous semiconductor alloy body having an active photoresponsive region including a band gap therein upon which radiation can impinge to produce charge carriers, said amorphous alloy including at least one density of states reducing element, said alloy further including one of a dopant or a band gap adjusting element therein to enhance the radiation absorption thereof without substantially increasing the effective states in the gap, at least one of said layers being formed with a plurality of substantially discrete subportions therein.

59. The device as defined in claim 58 wherein the band gap of said alloy is adjusted for a specified photoresponse wavelength threshold, said band gap being less than 1.6 eV.

60. The device as defined in claim 59 wherein said band gap adjusting element is germanium.

61. The device as defined in claim 58 wherein said alloy body is a multi-layer body formed of successively deposited layers of opposite (p and n) conductivity type, the n-type layer being formed by introducing during the deposition of the layer an n-dopant element which is deposited with the deposited layer to produce an n-type layer and the p-type layer being formed by introducing during deposition of the layer a p-dopant element which is deposited with the deposited layer to produce a p-type layer.

62. The device as defined in claim 61 wherein there is deposited between said p and n doped layers an intrinsic amorphous alloy layer without a p or n dopant element present therein, at least a portion of said intrinsic layer containing said band gap adjusting element.

63. The device as defined in claim 61 wherein said alloy body includes at least one of said opposite conductivity type layers in substantially discrete sublayers.

64. The device as defined in claim 61 wherein said alloy body includes at least one of said opposite conductivity type layers having varying amounts of dopants therein.

65. The device as defined in claim 61 wherein at least one of said opposite conductivity type layers includes substantially discrete portions of dopants therein.

66. The device as defined in claim 58 wherein said density of states reducing element is fluorine.

67. The device as defined in claim 66 further including a second density of states reducing element incorporated therein, said element being hydrogen.

68. The device as defined in claim 58 wherein said density of states reducing element is hydrogen.

69. The device as defined in claim 68 further including a second density of states reducing element incorporated therein, said element being fluorine.

70. The device as defined in claim 58 deposited by glow discharge deposition.

71. The device as defined in claim 58 wherein said alloy body includes said band gap adjusting element in substantially discrete sublayers.

72. The device as defined in claim 58 wherein said alloy body includes said dopant in substantially discrete sublayers.

73. The device as defined in claim 58 wherein said alloy body includes said band gap adjusting element in varying amounts.

74. The device as defined in claim 58 wherein said alloy body includes said dopant in varying amounts.

75. The device as defined in claim 58 wherein said alloy body includes said band gap adjusting element in substantially discrete clusters.

76. The device as defined in claim 58 wherein said alloy body includes said dopant in substantially discrete clusters.

77. The device as defined in claim 58 wherein said alloy body includes at least one of an n or p conductivity region therein, said region including an n or p dopant element therein.

78. The device as defined in claim 58 wherein said alloy body forms part of a Schottky barrier solar cell.

79. The device as defined in claim 58 wherein said alloy body forms part of an MIS solar cell.

80. The device as defined in claim 58 wherein said alloy body forms part of a p-n junction device.

81. The device as defined in claim 58 wherein said alloy body forms part of a p-i-n device.

82. The device as defined in claim 58 wherein said alloy body forms part of a photodetector.

83. The device as defined in claim 58 wherein said alloy body forms part of an electrostatic image producing device.

* * * * *